(12) United States Patent
Thapar

(10) Patent No.: US 6,580,123 B2
(45) Date of Patent: Jun. 17, 2003

(54) LOW VOLTAGE POWER MOSFET DEVICE AND PROCESS FOR ITS MANUFACTURE

(75) Inventor: Naresh Thapar, Los Angeles, CA (US)

(73) Assignee: International Rectifier Corporation, El Segundo, CA (US)

( * ) Notice: Subject to any disclaimer, the term of this patent is extended or adjusted under 35 U.S.C. 154(b) by 135 days.

(21) Appl. No.: 09/814,087

(22) Filed: Mar. 21, 2001

(65) Prior Publication Data

US 2001/0026989 A1 Oct. 4, 2001

Related U.S. Application Data

(60) Provisional application No. 60/194,386, filed on Apr. 4, 2000.

(51) Int. Cl.[7] ............................................. H01L 29/76
(52) U.S. Cl. .................... 257/330; 257/333; 257/340
(58) Field of Search ................... 257/330, 333, 257/335, 339, 340, 343, 341

(56) References Cited

U.S. PATENT DOCUMENTS

| | | | |
|---|---|---|---|
| 4,992,838 A | * 2/1991 | Mori | 257/330 |
| 5,298,780 A | * 3/1994 | Harada | 257/330 |
| 6,020,600 A | * 2/2000 | Miyajima et al. | 257/333 |
| 6,028,337 A | * 2/2000 | Letavic et al. | 257/339 |
| 6,262,453 B1 | * 7/2001 | Hshieh | 257/333 |

FOREIGN PATENT DOCUMENTS

| | | | |
|---|---|---|---|
| JP | 60-229373 | * 11/1985 | 257/340 |

* cited by examiner

Primary Examiner—Mark V. Prenty
(74) Attorney, Agent, or Firm—Ostrolenk, Faber, Gerb & Soffen, LLP

(57) ABSTRACT

A trench type power MOSFET has a thin vertical gate oxide along its side walls and a thickened oxide with a rounded bottom at the bottom of the trench to provide a low $R_{DSON}$ and increased $V_{DSMAX}$ and $V_{GSMAX}$ and a reduced Miller capacitance. The walls of the trench are first lined with nitride to permit the growth of the thick bottom oxide to, for example 1000 Å to 1400 Å and the nitride is subsequently removed and a thin oxide, for example 320 Å is regrown on the side walls. In another embodiment, the trench bottom in amorphized and the trench walls are left as single crystal silicon so that oxide can be grown much faster and thicker on the trench bottom than on the trench walls during an oxide growth step. A reduced channel length of about 0.7 microns is used. The source diffusion is made deeper than the implant damage depth so that the full 0.7 micron channel is along undamaged silicon. A very lightly doped diffusion of 1000 Å to 2000 Å in depth could also be formed around the bottom of the trench and is depleted at all times by the inherent junction voltage to further reduce Miller capacitance and switching loss.

22 Claims, 3 Drawing Sheets

LOW VOLTAGE POWER MOSFET DEVICE AND PROCESS FOR ITS MANUFACTURE

RELATED APPLICATIONS

This application is related to and claims priority to Provisional Application Ser. No. 60/194,386 filed Apr. 4, 2000 in the name of Naresh Thapar.

FIELD OF THE INVENTION

This invention relates to power MOSFET devices and their methods of manufacture, and more specifically relates to such devices with reduced $R_{DSON}$, reduced gate capacitance and increased gate breakdown voltage.

BACKGROUND OF THE INVENTION

In present trench type power MOSFET devices, a vertical gate oxide is formed simultaneously within the vertical walls of the trench and at the trench bottom. In order to provide a low $R_{DSON}$, the vertical oxide should be relatively thin. However, the gate to drain capacitance is determined by the thickness of the gate oxide at the trench bottom, and the gate breakdown voltage $V_{GSMAX}$ is limited by the curvatures of the oxide at the trench bottom corner. Thus, the desire for a thin vertical gate oxide for low $R_{DSON}$ is contradictory to the need of a thick oxide at the bottom of the trench for improved $V_{GSMAX}$ and a low gate to drain capacitance. It would be desirable to harmonize these trade-offs.

A further problem exists in present trench type power MOSFETS due to the conventional formation of the channel and source diffusions. Thus, these regions are usually formed by an implant followed by the diffusion. The implants are known to cause surface damage which extends to a particular depth, depending on the process variables. Therefore, the vertical channel, which extends from the point at which the source intersects the trench wall to the bottom of the channel diffusion, will include damaged silicon caused by the earlier implants. This then increases threshold voltage and increases the channel resistance. It would be desirable to avoid the influence of implant damage on the conduction channel of the device.

A still further problem exists in current power MOSFETs in that the inherent Miller capacitance of the structure increases the gate charge $Q_G$ of the device and thus increases switching loss. It would be desirable to reduce Miller capacitance to reduce switching loss.

BRIEF SUMMARY OF THE INVENTION

In accordance with a first aspect of this invention, a novel structure and process are provided which result in the production of a thick gate oxide at the bottom of the trench and a significantly thinner gate oxide along its vertical wall. Thus, a trench is first etched in conventional fashion, through a source diffusion layer and channel diffusion layer and the trench walls and bottom have a silicon nitride coating deposited thereon. A thermally grown pad oxide may be formed before depositing the silicon nitride. The silicon nitride at the bottom surface of the trench is then reactively etched away, and a silicon dioxide layer is then grown on the exposed silicon at the bottom of the trench. The bottom oxide layer is grown to any desired thickness, for example, 1000 Å to 1400 Å in comparison to the conventional oxide thickness of about 320 Å used for the side wall gate oxide in the conventional device. During its growth, the oxide and the silicon at the corners of the trench round out to smooth or round the otherwise sharp bottom corners of the trench.

In another embodiment of the invention, the thicker bottom oxide is formed by amorphizing the trench bottom by using a heavy dose ion implantation (for example 1E16 atoms/cm$^2$) of a neutral species ion, for example, Argon, after the trench etch. This process makes use of the fact that amorphized silicon oxidizes 3 or 4 times faster than the single crystal silicon surface along the vertical trench walls.

Thereafter, the silicon nitride layer remaining on the trench walls is removed by a wet etch which leaves the thick bottom oxide layer intact. A thin gate oxide (320 Å for example) is then grown on the exposed side walls.

The resulting structure has the desired thick bottom oxide and rounded silicon bottom for increased $V_{DSMAX}$ and $V_{GSMAX}$ and reduced Miller capacitance; and a thin gate oxide on the trench walls for reduced $R_{DSON}$.

The channel length of the new device is also reduced to about 0.7 microns (from 1.2 microns for the same voltage in the prior art).

In forming the source and channel diffusions, the impurity atoms are implanted into the silicon and diffused before forming the trench. When the diffusions are shallow, as for a low voltage device with a reduced channel length (for example, 0.5 microns) part of the blocking voltage is held off only by the channel. However, the channel may include silicon along the trench wall which was damaged during the implant process. In accordance with a further feature of the invention, the source diffusion in a short channel low voltage MOSFET is made intentionally deeper than the implant damage depth. In this way, the full channel length will be along undamaged silicon so that threshold voltage and $R_{DSON}$ characteristics are unaffected by silicon crystal implant damage.

As a still further feature of the invention, and to further reduce Miller capacitance, a very lightly doped P$^{--}$ or N$^{--}$ diffusion of about 1000 Å to about 2000 Å in depth is formed around the bottom of the trench. The P$^{--}$ diffusion will be depleted at all times by the inherent junction voltage, thus reducing Miller capacitance and switching loss. This concept is applicable to planer devices as well as trench devices.

DETAILED DESCRIPTION OF THE DRAWINGS

Figure 1A:
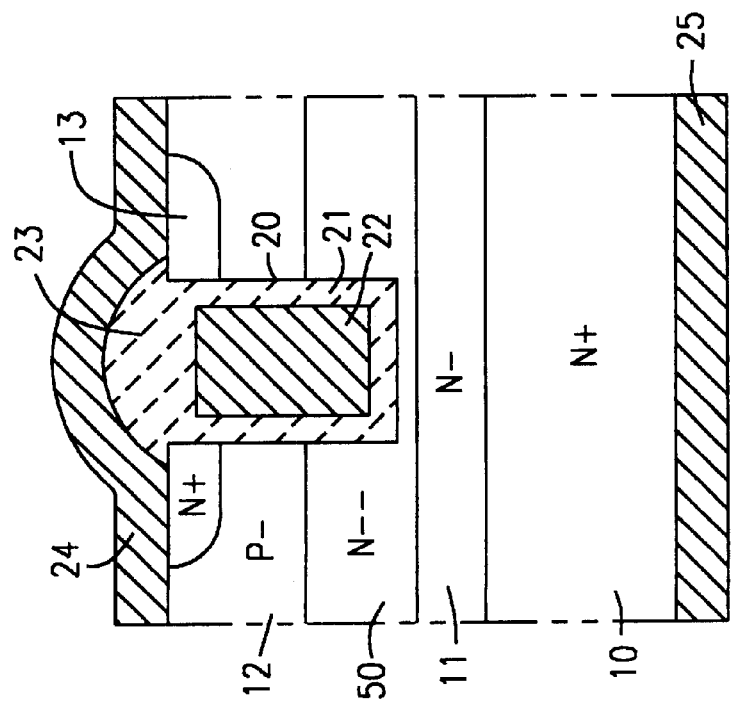
FIG. 1A is a cross-section of a trench with a P$^{--}$/N$^{--}$ implant to reduce Miller capacitance.

Referring first to FIG. 1A, there is shown in cross-section, a very small portion of a trench MOSFET at an early stage of its manufacture. Thus, an N$^+$ chip 10 of monocrystalline silicon is first prepared and an N$^-$ layer 11 of epitaxially grown silicon is formed thereon. A P$^-$ dopant is then implanted and diffused into the top of layer 11 to form P$^-$ channel diffusion 12 to a given depth. Thereafter, an N$^+$ source impurity is implanted through a suitable mask to form spaced N⁺ source regions such as source region 13 which are also diffused to a given depth. Source region 13 may have any desired topology and can be a stripe or a cell or the like.

Thereafter, trenches such as trench 20 are etched in the silicon, and a silicon dioxide gate layer 21 having a thickness of about 320 Å is grown along the walls and bottom of the trench 20. A conductive polysilicon gate 22 is formed within trench 20 and the top of the polysilicon 22 is capped with an oxide cap 23.

A source electrode 24 is then formed over the top surface of the device and in contact with source regions 13 and channel region 12. A drain metal 25 is also applied to the bottom of body 10.

It is to be noted that the same elements in FIGS. 1A, 1B and 2 to 5 carry the same identifying numerals.

The structure described to this point is the well known trench MOSFET structure. In accordance with a first feature of the invention, and to reduce Miller capacitance (the capacitance between gate and drain) and thus $Q_G$ for increased speed, a very lightly doped P⁻⁻/N⁻⁻⁻ diffusion 30 is formed in the trench wall before or after the gate oxide step but before the formation of polysilicon 22. The diffusion depth is preferably 1000 Å to 2000 Å deep. This P⁻⁻ diffusion 30 will have a concentration sufficiently low to be at all times depleted by the built-in junction voltage to substrate 11, thereby reducing Miller capacitance.

Figure 2:
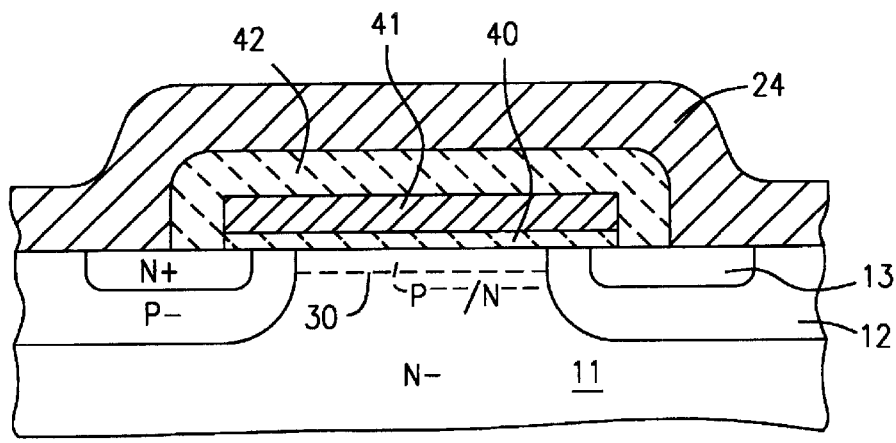
FIG. 2 is a cross-section of one cell element of a planar geometry chip with the novel P$^{--}$/N$^{--}$ implant.

FIG. 2 shows that the same diffusion 30 can be used in an otherwise conventional planar MOSFET structure having gate oxide 40, polysilicon 31, LTO layer 42 and the source metal 24.

Figure 1B:
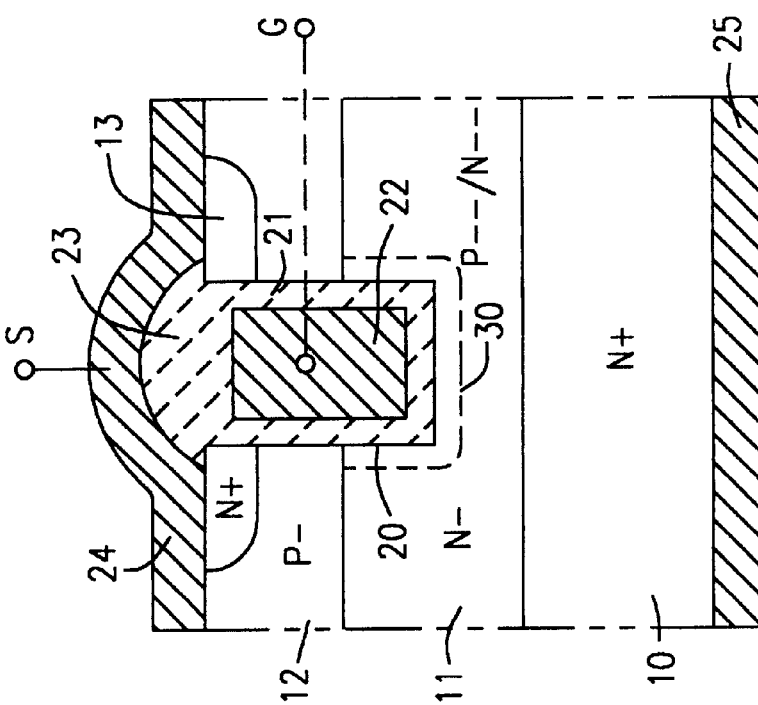
FIG. 1B shows an alternative embodiment to the structure of FIG. 1A.

FIG. 1B shows a further embodiment of the invention of FIGS. 1A and 2 in which the P⁻⁻ diffusion of FIG. 1A is replaced by a 3 micron deep N⁻⁻ region 50 which receives trench 20 and acts like a very thin N type depletion layer. N⁻⁻ region 50 has a concentration of about $1 \times 10^{14}$ atoms/cm³ and will be fully depleted by the built-in junction charge.

The doping concentration for P⁻⁻ region 30 of FIGS. 1A and 2 can be produced by an implant dose of about $1 \times 10^{12}$ atoms/cm². By comparison, N⁻⁻ region 50 is 50 Ωcm and N⁺ region 11 is 0.003 ohm cm material.

Figure 3:
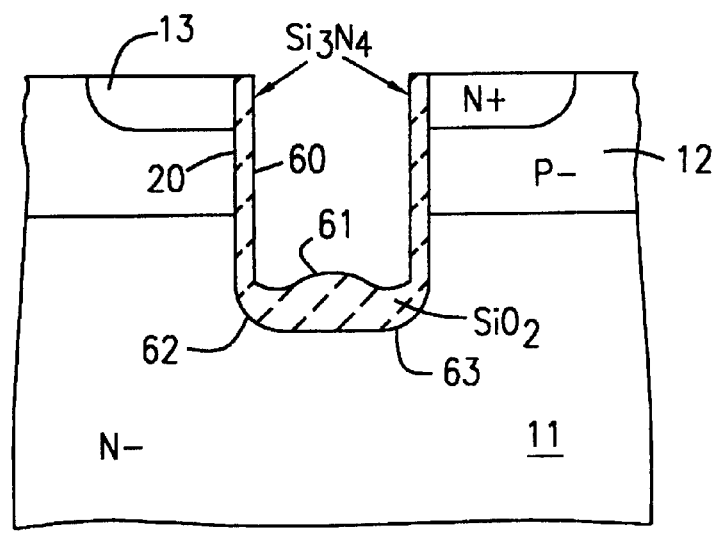
FIG. 3 shows a silicon chip with a trench at a stage of processing in which the trench has a thick silicon dioxide layer on its bottom and a silicon nitride layer on its walls.
Figure 4:
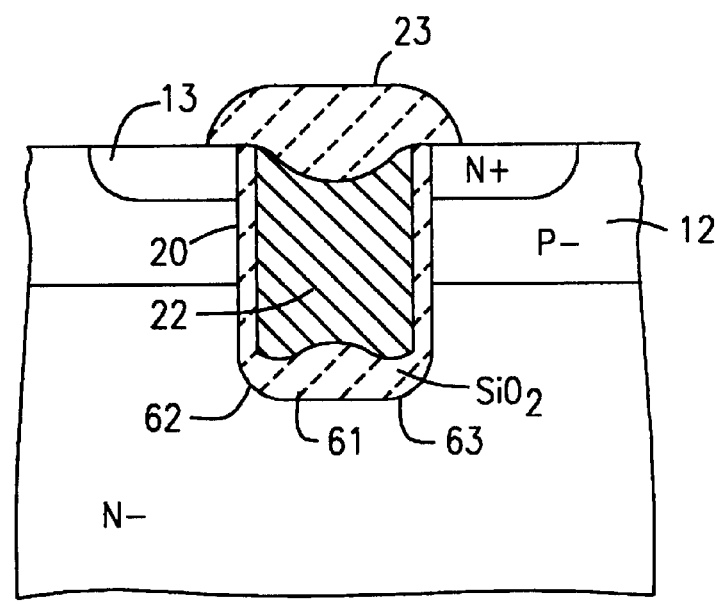
FIG. 4 shows the structure of FIG. 3 after the nitride layer is removed from the walls and is replaced by a thin oxide.

FIGS. 3 and 4 show a novel structure and process for reducing the gate-to-drain capacitance of the device by using a thick bottom oxide but thin side wall oxide in the trench, thus preserving low on-resistance. More specifically, in prior art trench devices, the bottom oxide thickness was that of the side wall thickness which is about 320 Å. In accordance with the present invention, the bottom oxide layer is increased in thickness to 1000 Å to 1400 Å and the trench is rounded at the trench corners to increase the drain/source breakdown voltage and gate-drain breakdown voltage at those corners.

Thus, after the trench 20 is formed in FIG. 3, its walls and bottom are lined with silicon nitride as by a conventional Si₃N₄ deposition process. The nitride at the bottom of the trench is then removed, using a suitable reactive etch process, leaving intact the nitride on the trench walls, shown as nitride layers 60 in FIG. 3. Thereafter, oxide is grown on the exposed silicon bottom of trench 20, forming the thick oxide layer 61 in FIG. 3. Layer 61 may have a thickness if from 1000 Å to 1400 Å (by way of example) and, fortuitously, will create rounded edges 62, 63 (or a rounded trench bottom periphery if the trench is polygonal in cross-section). Thereafter, the nitride 60 of FIG. 3 is removed by a suitable nitride etch, for example, H₃PO₄ which leaves intact the oxide 61. A thin gate oxide 62 (FIG. 4) may then be grown on the exposed side walls of trench 20 to a thickness of 300 Å to 320 Å.

In another embodiment of the invention, after the trench 20 is formed, a heavy dose implant (for example, 1E16 atoms/cm²) of a neutral species, (for example, Argon) is applied to the bottom of the trench only, converting the singe crystal silicon at the trench bottom to an amorphized silicon. An oxide growth step then takes place of growing oxide on the single crystal trench walls and on the amorphized bottom trench surface. The oxide on the amorphized silicon grows about 3 to 4 times faster than on the trench walls, thus providing the trench with the desired thickened bottom.

The device is then completed in the well known manner by the formation of the polysilicon gate and source and drain electrodes.

The resulting device will have reduced gate-to-drain capacitance and will have improved voltage withstand ability because of the thick oxide 61 and the rounded trench bottom edges, rather than the sharper trench edges of the prior art.

Figure 5:
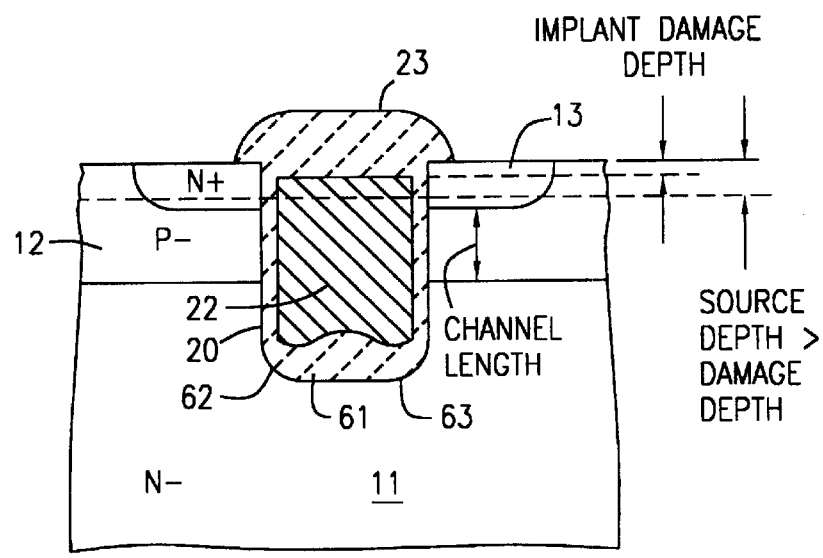
FIG. 5 shows the trench structure of FIG. 4 in which a reduced channel length is used with the source diffusion being deeper than the depth of the implant damage.

It is desirable for devices such as that of FIG. 4 to have a shorter channel length while still holding off reverse voltage in the channel only. Thus, it was conventional for low voltage trench MOSFETs to use a channel length along the trench wall of about 1.3 microns. It has been found, as shown in FIG. 5, that a reduced channel length can be used, for example, 0.7 microns. To make such devices, it becomes necessary to consider that the channel may include a significant length of implant induced damage caused during the implant of P⁻ region 12 and N⁺ source region 13. In accordance with another aspect of the present invention, the source region 13 is intentionally diffused to a depth greater than the depth of the implant damage. In this way, the full reduced length channel is in undamaged silicon so that it can better hold off full source to drain voltage.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A trench type MOSgated power semiconductor device comprising a water of silicon of one conductivity type; a plurality of spaced trenches formed into the top surface of said wafer and extending therein to a given depth; an insulation coating lining the side walls and bottom of said trench; a conductive gate body filling the interior of each of said trenches; a channel region of a second conductivity type extending into the top of said wafer to a first depth which is less than said given depth; a source region of said one conductivity type extending into said channel region to a second depth from the top of said wafer to define invertable channels along the sides of said trench in said channel region which extends between said first and second depths; a source electrode formed on the top surface of said wafer and connected to said source and channel regions; a drain electrode connected to the bottom of said wafer; and a shallow diffusion of the second conductivity type surrounding the bottom of each of said trenches, said shallow diffusion having a concentration substantially less than that of said channel region and being at all times depleted by the built-in junction voltage at its junction to the surrounding one conductivity type material of said wafer.

2. The device of claim 1 wherein said one conductivity type is the N type and said second conductivity type is the P type.

3. The device of claim 1 wherein said wafer has an epitaxially deposited layer of said one conductivity type extending from the top of said wafer and receiving said trenches and said channel and source regions.

4. The device of claim 1 wherein said insulation coating is silicon dioxide.

5. The device of claim 1 wherein said insulation coating in said side walls has a thickness of about 320 Å and said insulation coating on the bottom of said trench having a thickness greater than about 1000 Å and having a positively curved bottom surface without sharp corners.

6. The device of claim 1 wherein said conductive gate body is a conductive polysilicon.

7. The device of claim 1 wherein said trenches have a topology selected from the group consisting of symmetrically distributed vertical cells and parallel extending vertical stripes.

8. The device of claim 3 wherein said one conductivity type is the N type and said second conductivity type is the P type.

9. The device of claim 4 wherein said one conductivity type is the N type and said second conductivity type is the P type.

10. The device of claim 5 wherein said one conductivity type is the N type and said second conductivity type is the P type.

11. The device of claim 6 wherein said one conductivity type is the N type and said second conductivity type is the P type.

12. The device of claim 8 wherein said insulation coating is silicon dioxide.

13. The device of claim 12 wherein said insulation coating in said side walls has a thickness of about 320 Å and said insulation coating on the bottom of said trench having a thickness greater than about 1000 Å and having a positively curved bottom surface without sharp corners.

14. The device of claim 13 wherein said conductive gate body is a conductive polysilicon.

15. The device of claim 1 wherein the vertical distance between said first and second depth is about 0.7 microns.

16. The device of claim 15 wherein said source region is formed by an implant and subsequent diffusion process which produces implant damage to a third depth; said source region second depth being greater than said third depth, whereby said invertable channel regions are formed in undamaged silicon for their full lengths.

17. In a MOSgated power semiconductor device comprising a drain conductor region of one conductivity type, a source conductive region of said one conductivity type, and a channel conductor region of the opposite conductivity type; a gate oxide layer extending from said source conductive region, across said channel conductive region and to said drain conductive region and a conductive gate electrode disposed on a surface of said gate oxide and operable to produce an inversion layer in said channel region to permit conduction between said source and drain regions; a shallow, lightly doped diffusion of said opposite conductivity type in said drain conductor region adjacent said gate oxide, said shallow diffusion being doped only enough to deplete by the inherent junction voltage of the junction between said shallow diffusion and said drain region.

18. The device of claim 17 wherein said shallow diffusion has a depth of less than about 2000 Å.

19. The device of claim 17 wherein said shallow diffusion has a concentration which is substantially less than the concentration of said channel region.

20. The device of claim 18 wherein said shallow diffusion has a concentration which is substantially less than the concentration of said channel region.

21. The device of claim 19 wherein said shallow diffusion is formed by an implant dose of about $1 \times 10^{12}$ atoms/cm$^2$.

22. The device of claim 19 wherein said device is a trench type MOSFET and wherein said shallow diffusion is formed around the bottom of a trench which receives said gate oxide.

\* \* \* \* \*